US012741978B2

(12) United States Patent
Fukushima et al.

(10) Patent No.: US 12,741,978 B2
(45) Date of Patent: Sep. 22, 2026

(54) ZINC COMPOUND, THIN-FILM FORMING RAW MATERIAL, THIN-FILM, AND METHOD OF PRODUCING THIN-FILM

(71) Applicant: ADEKA CORPORATION, Tokyo (JP)

(72) Inventors: Ryota Fukushima, Tokyo (JP); Keisuke Takeda, Tokyo (JP); Masaki Enzu, Tokyo (JP)

(73) Assignee: ADEKA CORPORATION, Tokyo (JP)

( * ) Notice: Subject to any disclaimer, the term of this patent is extended or adjusted under 35 U.S.C. 154(b) by 344 days.

(21) Appl. No.: 17/915,300

(22) PCT Filed: Mar. 18, 2021

(86) PCT No.: PCT/JP2021/011089

§ 371 (c)(1),
(2) Date: Sep. 28, 2022

(87) PCT Pub. No.: WO2021/200219

PCT Pub. Date: Oct. 7, 2021

(65) Prior Publication Data

US 2023/0142848 A1 May 11, 2023

(30) Foreign Application Priority Data

Apr. 1, 2020 (JP) ................................ 2020-065627

(51) Int. Cl.
*C07F 3/06* (2006.01)
*C23C 16/40* (2006.01)
*C23C 16/455* (2006.01)

(52) U.S. Cl.
CPC .............. *C07F 3/06* (2013.01); *C23C 16/407* (2013.01); *C23C 16/45553* (2013.01)

(58) Field of Classification Search
CPC .......... C07F 3/003; C07F 3/06; C23C 16/407; C23C 16/45553
See application file for complete search history.

(56) References Cited

U.S. PATENT DOCUMENTS

| | | | | |
|---|---|---|---|---|
| 12,104,245 | B2 * | 10/2024 | Sakurai | C07F 15/045 |
| 2007/0178235 | A1 | 8/2007 | Yamada et al. | |
| 2009/0275164 | A1 * | 11/2009 | Chen | C23C 16/305 427/255.6 |
| 2022/0389570 | A1 | 12/2022 | Sakurai et al. | |

FOREIGN PATENT DOCUMENTS

| | | |
|---|---|---|
| CN | 107531734 | 1/2018 |
| JP | 2003-236376 | 8/2003 |
| JP | 2005-350423 | 12/2005 |
| WO | 2016/203887 | 12/2016 |
| WO | 2021/085210 | 5/2021 |

OTHER PUBLICATIONS

Khusniyarov (Angew. Chem. Int. Ed. 2011, 50, 1652-1655).*

Extended European Search Report issued Jun. 18, 2024 in European Patent Application No. 21778924.7.

Claire L. McMullin, et al., "Complete methane-to-methanol catalytic cycle: A DFT study of oxygen atom transfer from $N_2O$ to late-row (M=Ni, Cu, Zn) B-diketiminate C-H activation catalysts", Polyhedron, 2013, vol. 52, pp. 945-956.

R. Bonnett, et al., "Metallo-organic Compounds containing Metal-Nitrogen Bonds. Part VII. Synthesis and Properties of Bis-(NN'-diethylbutane-1,3-di-iminato) Derivatives of Cobalt(II) and Zinc", J. Chem. Soc. (A), 1971, pp. 1622-1627.

International Search Report issued May 11, 2021 in International (PCT) Application No. PCT/JP2021/011089.

O'Donoghue et al., "Systematic molecular engineering of Zn-ketoiminates for application as precursors in atomic layer depositions of zinc oxide", Dalton Transactions, 2016, vol. 45, pp. 19012-19023.

(Continued)

*Primary Examiner* — Pancham Bakshi
(74) *Attorney, Agent, or Firm* — Wenderoth, Lind & Ponack, L.L.P.

(57) ABSTRACT

Provided is a zinc compound represented by the following general formula (1) or (2):

(1)

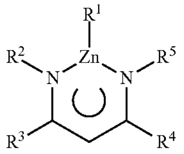

in the formula (1), $R^1$ represents an unsubstituted alkyl group having 1 to 5 carbon atoms, etc., $R^2$ and $R^5$ each independently represent a hydrogen atom, a fluorine atom, an unsubstituted alkyl group having 1 to 5 carbon atoms, etc., and $R^3$ and $R^4$ each independently represent a hydrogen atom, a fluorine atom, an unsubstituted alkyl group having 1 to 5 carbon atoms, etc.;

(2)

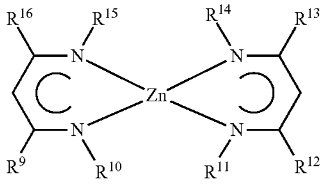

in the formula (2), $R^{10}$, $R^{11}$, $R^{14}$, and $R^{15}$ each independently represent a hydrogen atom, a fluorine atom, an unsubstituted alkyl group having 1 to 5 carbon atoms, etc., and $R^9$, $R^{12}$, $R^{13}$, and $R^{16}$ each independently represent a hydrogen atom, a fluorine atom, an unsubstituted alkyl group having 1 to 5 carbon atoms, etc.

8 Claims, 4 Drawing Sheets

(56) References Cited

OTHER PUBLICATIONS

Cosham et al., "Synthesis and Characterization of Fluorinated ß-Ketoiminate Zinc Precursors and Their Utility in the Ap-MOCVD Growth of ZnO:F", European Journal of Inorganic Chemistry, 2015, pp. 4362-4372.

Singh et al., "Studies on energetic compounds Part 35: Kinetics of thermal decomposition of nitrate complexes of some transition metals with propylenediamine", Combustion and Flame, 2003, vol. 135, pp. 135-143.

Singh et al., "Studies On Energetic Compounds Part 40. Kinetics of thermal decomposition of some bis(propylenediamine)metal perchlorate complexes", Journal of Thermal Anaylysis and Calorimetry, 2005, vol. 82, pp. 353-360.

Marat M. Khusniyarov et al., "Hidden Noninnocence: Theoretical and Experimental Evidence for Redox Activity of a ß-Diketiminate(1-) Ligand", Angew. Chem., 2011, vol. 123, pp. 1690-1693.

Author unknown, CAS Registry No. 1429228-01-2; Entered STN: Apr. 25, 2013; 2 pages.

* cited by examiner

CARRIER GAS 1
MFC
RAW MATERIAL CONTAINER
MFC
VAPORIZATION CHAMBER
MFC
CARRIER GAS 2
MFC
PURGE GAS
REACTIVE GAS
MASS FLOW CONTROLLER (MFC)
FILM FORMATION CHAMBER
EXHAUST
VACUUM PUMP
COOLING TRAP
AUTOMATIC PRESSURE CONTROLLER

ZINC COMPOUND, THIN-FILM FORMING RAW MATERIAL, THIN-FILM, AND METHOD OF PRODUCING THIN-FILM

TECHNICAL FIELD

The present invention relates to a zinc compound having a specific structure, a thin-film forming raw material including the zinc compound, a thin-film obtained by using the thin-film forming raw material, and a method of producing the thin-film.

BACKGROUND ART

A thin-film forming raw material including a zinc compound shows specific electrical characteristics, and hence its applications to, in particular, uses in optoelectronics, such as a semiconductor element, a solar cell, and an LED, have been advanced.

Examples of a method of producing a thin-film include a sputtering method, an ion plating method, metal organic decomposition (MOD) methods, such as a coating thermal decomposition method and a sol-gel method, a chemical vapor deposition (CVD) method, and an atomic layer deposition (ALD) method. Of those, a CVD method or an ALD method is mainly used because the thin-film to be obtained has satisfactory quality.

The CVD method and the ALD method are each a thin-film formation technology based on chemical vapor deposition. In particular, the ALD method enables the formation of thin-films having fine shapes because the method enables the control of atomic layers on the surfaces of the thin-films through the growth of materials supplied by precursors to the surfaces of substrates having various compositions. A necessity for the ALD method has been growing because the development of nanotechnology and of the downsizing of an electronic material device, such as a capacitor electrode, a gate electrode, or an integrated circuit, has been incessantly advanced. A thin-film forming raw material to be used in the ALD method has been required to have a high vapor pressure and excellent thermal stability, and to be capable of forming a high-quality thin-film. The term "high-quality thin-film" means that a residual carbon amount in the film is small.

The following has been known about, for example, diethylzinc serving as a zinc compound to be used as a thin-film forming raw material. A film thickness that can be formed per cycle is thick (~0.18 nm/cycle). In Patent Document 1, there is a disclosure that a zinc oxide thin-film is formed by using zinc acetylacetonate and by using a MOCVD method. In Patent Document 2, there is a disclosure of a bis(β-diketonato)zinc compound. In addition, in Non Patent Document 1, there is a description that a zinc ketoimine compound shows an excellent vapor property in the temperature range of from 170° C. to 270° C.

CITATION LIST

Patent Document

Patent Document 1: JP 2003-236376 A

Patent Document 2: JP 2005-350423 A

Non Patent Document

Non Patent Document 1: "Systematic molecular engineering of Zn-ketoiminates for application as precursors in atomic layer depositions of zinc oxide", Dalton Trans., 2016, 45, p. 19012-19023

SUMMARY OF INVENTION

Technical Problem

However, diethylzinc has not been satisfactory in terms of quality of a thin-film to be obtained because of its poor thermal stability. Each of the zinc compounds described in Patent Document 1 and Patent Document 2 has not always been satisfactory in terms of quality of a thin-film to be obtained because reactivity between a precursor thin-film derived from the compound and a reactive gas is poor. In addition, the zinc ketoimine compound described in Non Patent Document 1 has involved a problem in that the temperature at which the compound turns into vapor is high.

Accordingly, an object of the present invention is to provide a zinc compound, which can be turned into vapor at low temperature, is excellent in thermal stability, and can produce a high-quality thin-film when used as a thin-film forming raw material. Another object of the present invention is to provide a thin-film forming raw material including the zinc compound, a thin-film obtained by using the thin-film forming raw material, and a method of producing the thin-film.

Solution to Problem

The inventors of the present invention have made extensive investigations, and as a result, have found that a zinc compound having a specific structure can solve the above-mentioned problems. Thus, the inventors have completed the present invention.

That is, according to one embodiment of the present invention, there is provided a zinc compound, which is represented by the following general formula (1) or (2):

(1)

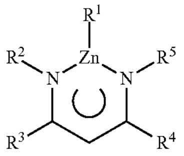

in the formula (1), represents an unsubstituted alkyl group having 1 to 5 carbon atoms, or an alkyl group having 1 to 5 carbon atoms in which part or all of hydrogen atoms are each substituted with a fluorine atom, $R^2$ and $R^5$ each independently represent a hydrogen atom, a fluorine atom, an unsubstituted alkyl group having 1 to 5 carbon atoms, an alkyl group having 1 to 5 carbon atoms in which part or all of hydrogen atoms are each substituted with a fluorine atom, an alkyl group having 1 to 5 carbon atoms in which part or all of hydrogen atoms are each substituted with $—OR^6$, or an alkyl group having 1 to 5 carbon atoms in which part or all of hydrogen atoms are each substituted with $—NR^7R^8$, $R^3$ and $R^4$ each independently represent a hydrogen atom, a fluorine atom, an unsubstituted alkyl group having 1 to 5 carbon atoms, or an alkyl group having 1 to 5 carbon atoms in which part or all of hydrogen atoms are each substituted with a fluorine atom, and $R^6$, $R^7$, and $R^8$ each independently represent an unsubstituted alkyl group having 1 to 5 carbon atoms, or an alkyl group having 1 to 5 carbon atoms in which part or all of hydrogen atoms are each substituted with a fluorine atom;

(2)

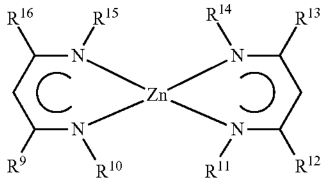

in the formula (2), $R^{10}$, $R^{11}$, $R^{14}$, and $R^{15}$ each independently represent a hydrogen atom, a fluorine atom, an unsubstituted alkyl group having 1 to 5 carbon atoms, an alkyl group having 1 to 5 carbon atoms in which part or all of hydrogen atoms are each substituted with a fluorine atom, an alkyl group having 1 to 5 carbon atoms in which part or all of hydrogen atoms are each substituted with —$OR^{17}$, or an alkyl group having 1 to 5 carbon atoms in which part or all of hydrogen atoms are each substituted with —$NR^{18}R^{19}$, $R^9$, $R^{12}$, $R^{13}$, and $R^{16}$ each independently represent a hydrogen atom, a fluorine atom, an unsubstituted alkyl group having 1 to 5 carbon atoms, or an alkyl group having 1 to 5 carbon atoms in which part or all of hydrogen atoms are each substituted with a fluorine atom, and $R^{17}$, $R^{18}$, and $R^{19}$ each independently represent an unsubstituted alkyl group having 1 to 5 carbon atoms, or an alkyl group having 1 to 5 carbon atoms in which part or all of hydrogen atoms are each substituted with a fluorine atom.

According, to one embodiment of the present invention, there is provided a thin-film forming raw material, including the zinc compound above.

According to one embodiment of the present invention, there is provided a thin-film, which is obtained by using the thin-film forming raw material above.

According to one embodiment of the present invention, there is provided a method of producing a thin-film, including the steps of: introducing a raw material gas, which is obtained by vaporizing the thin-film forming raw material above, into a film formation chamber having set therein a substrate; and subjecting the zinc compound in the raw material gas to decomposition and/or a chemical reaction, to thereby form a thin-film containing a zinc atom (hereinafter referred to as "zinc-containing thin-film") on a surface of the substrate.

Advantageous Effects of Invention

According to the present invention, the zinc compound, which can be turned into vapor at low temperature, is excellent in thermal stability, and can produce a high-quality thin-film when used as a thin-film forming raw material, can be provided. In addition, according to the present invention, a high-quality zinc-containing thin-film can be formed by a CVD method, in particular, an ALD method.

DESCRIPTION OF EMBODIMENTS

Figure 1:
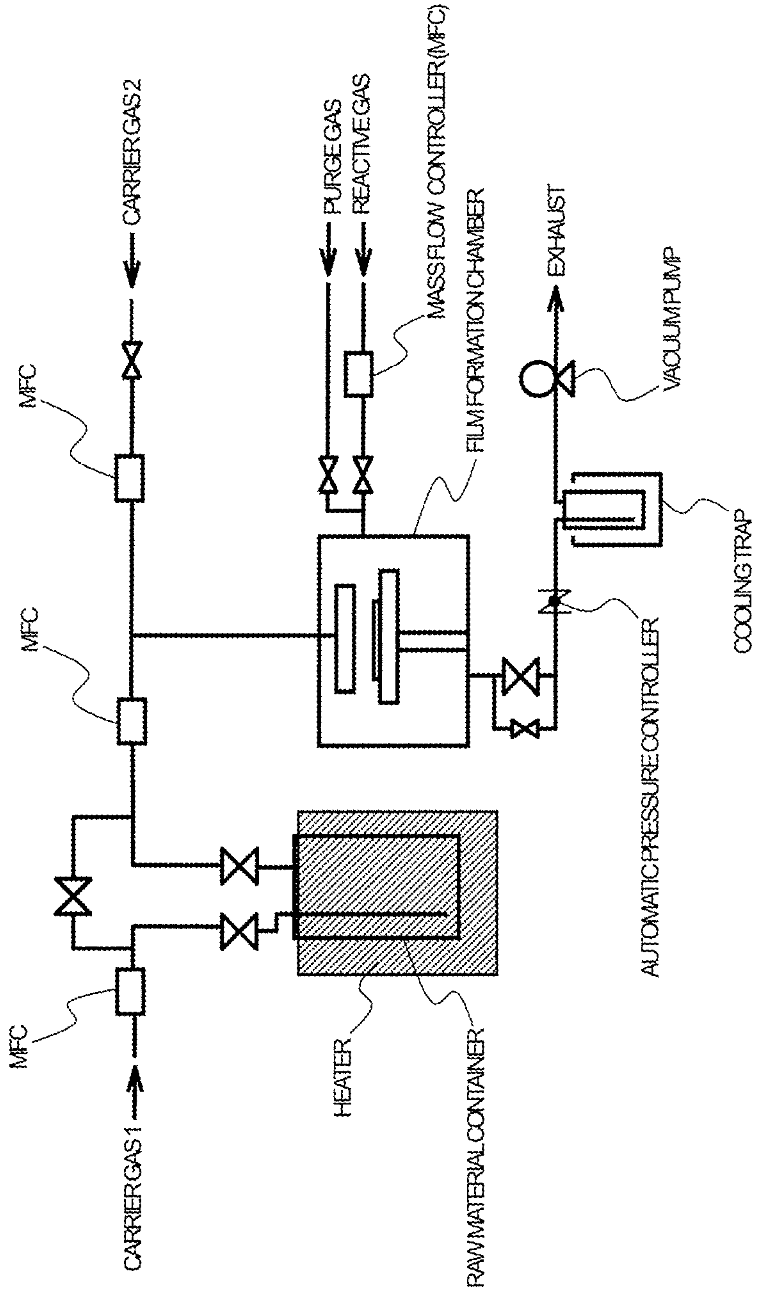
FIG. 1 is a schematic diagram for illustrating an example of an ALD apparatus to be used in a method of producing a thin-film according to the present invention.

A zinc compound of the present invention is represented by the above-mentioned general formula (1) or (2).

Examples of the unsubstituted alkyl group having 1 to 5 carbon atoms that is represented by each of $R^1$ to $R^8$ in the general formula (1) include a methyl group, an ethyl group, a n-propyl group, an isopropyl group, a n-butyl group, a sec-butyl group, a tert-butyl group, an isobutyl group, a n-pentyl group, a sec-pentyl group, a tert-pentyl group, an isopentyl group, and a neopentyl group. A zinc compound in which at least one of $R^1$ to $R^3$ represents an alkyl group having 1 to 4 carbon atoms is preferred, and a zinc compound in which at least one of $R^1$ to $R^3$ represents a methyl group, an ethyl group, an isopropyl group, a sec-butyl group, or a tert-butyl group is more preferred.

Examples of the alkyl group having 1 to 5 carbon atoms in which part or all of hydrogen atoms are each substituted with a fluorine atom, the group being represented by each of $R^1$ to $R^8$ in the general formula (1), include a fluoromethyl group, a difluoromethyl group, a trifluoromethyl group, a fluoroethyl group, a difluoroethyl group, a trifluoroethyl group, a pentafluoroethyl group, a fluoropropyl group, a heptafluoropropyl group, a fluoropentyl group, and an undecylfluoropentyl group. A zinc compound in which at least one of $R^1$ to $R^2$ represents an alkyl group having 1 to 3 carbon atoms in which part or all of hydrogen atoms are each substituted with a fluorine atom is preferred, and a zinc compound in which at least one of $R^1$ to $R^8$ represents a fluoromethyl group, a difluoromethyl group, a trifluoromethyl group, or a pentafluoroethyl group is more preferred.

Examples of the alkyl group having 1 to 5 carbon atoms in which part or all of hydrogen atoms are each substituted with —$OR^6$, the group being represented by each of $R^2$ and $R^5$ in the general formula (1), include a methoxymethyl group, an ethoxymethyl group, a propoxymethyl group, an ethoxyethyl group, an isopropoxyethyl group, an ethoxypropyl group, a methoxybutyl group, a fluoromethoxymethyl group, a difluoromethoxymethyl group, a trifluoromethoxymethyl group, a trifluoromethoxyethyl group, and a trifluoromethoxypropyl group. A zinc compound in which at least one of $R^2$ and $R^5$ represents a methoxymethyl group, a methoxyethyl group, an isopropoxyethyl group, or a trifluoromethoxymethyl group is preferred.

Examples of the alkyl group having 1 to 5 carbon atoms in which part or all of hydrogen atoms are each substituted with —$NR^7R^8$, the group being represented by each of $R^2$ and $R^5$ in the general formula (1), include a dimethylaminomethyl group, a diethylaminomethyl group, a methylpropylaminomethyl group, a dimethylaminoethyl group, an ethylmethylaminomethyl group, and an ethylmethylaminoethyl group. A zinc compound in which at least one of $R^2$ and $R^5$ represents a dimethylaminomethyl group, a dimethylaminoethyl group, or an ethylmethylaminomethyl group is preferred.

Examples of the unsubstituted alkyl group having 1 to 5 carbon atoms that is represented by each of $R^9$ to $R^{19}$ in the general formula (2) include the same groups as those exemplified for $R^1$ to $R^8$ in the general formula (1). A zinc compound in which at least one of $R^9$ to $R^{19}$ represents an alkyl group having 1 to 4 carbon atoms is preferred, and a zinc compound in which at least one of $R^9$ to $R^{19}$ represents a methyl group, an ethyl group, an isopropyl group, a sec-butyl group, or a tert-butyl group is more preferred.

Examples of the alkyl group having 1 to 5 carbon atoms in which part or all of hydrogen atoms are each substituted with a fluorine atom, the group being represented by each of $R^9$ to $R^{19}$ in the general formula (2), include the same groups as those exemplified for $R^1$ to $R^8$ in the general formula (1). A zinc compound in which at least one of $R^9$ to $R^{19}$ represents an alkyl group having 1 to 3 carbon atoms in which part or all of hydrogen atoms are each substituted with a fluorine atom is preferred, and a zinc compound in which at least one of $A^9$ to $A^{19}$ represents a fluoromethyl group, a difluoromethyl group, a trifluoromethyl group, or a pentafluoroethyl group is more preferred.

Examples of the alkyl group having 1 to 5 carbon atoms in which part or all of hydrogen atoms are each substituted with —$OR^{17}$, the group being represented by each of $R^{10}$, $R^{11}$, $R^{14}$, and $R^{15}$ in the general formula (2), include the same groups as those exemplified for —$OR^6$ in the general formula (1). A zinc compound in which at least one of $R^{10}$, $R^{11}$, $R^{14}$, and $R^{15}$ represents a methoxymethyl group, a methoxyethyl group, an isopropoxyethyl group, or a trifluoromethoxymethyl group is preferred.

Examples of the alkyl group having 1 to 5 carbon atoms in which part or all of hydrogen atoms are each substituted with —$NR^{18}R^{19}$, the group being represented by each of $R^{10}$, $R^{11}$, $R^{14}$, and $R^{15}$ in the general formula (2), include the same groups as those exemplified for —$NR^7R^8$ in the general formula (1). A zinc compound in which at least one of $R^{10}$, $R^{11}$, $R^{14}$, and $R^{15}$ represents a dimethylaminomethyl group, a dimethylaminoethyl group, or an ethylmethylaminomethyl group is preferred.

The zinc compound of the present invention may be produced by utilizing a well-known method. For example, a zinc compound in which in the general formula (1), $R^1$, $R^2$, and $R^5$ represent ethyl groups, and $R^3$ and $R^4$ represent methyl groups may be obtained by: reacting diethylzinc with a dialkyldiketimine compound in a solvent; removing the solvent after the reaction; and purifying the residue through distillation. A zinc compound in which in the general formula (1), $R^1$ represents an ethyl group is preferred because the compound has a low melting point and a high vapor pressure, and hence can form a zinc-containing thin-film with high productivity. In addition, a zinc compound in which in the general formula (2), $R^9$, $R^{12}$, $R^{13}$, and $R^{16}$ represent methyl groups, and $R^{10}$, $R^{11}$, $R^{14}$, and $R^{15}$ represent ethyl groups may be obtained by: reacting diethylzinc with 2 equivalents of a dialkyldiketimine compound in a solvent; removing the solvent after the reaction; and purifying the residue through distillation. A zinc compound in which in the general formula (2), two or more of $R^9$, $R^{12}$, $R^{13}$, and $R^{16}$ represent trifluoromethyl groups is preferred because the compound has a low melting point and a high vapor pressure, and hence can form a zinc-containing thin-film with high productivity.

Although preferred specific examples of the zinc compounds represented by the general formulae (1) and (2) include Compound No. 1 to Compound No. 68 below, the present invention is not limited to these zinc compounds. In Compound No. 1 to Compound No. 68 below, the symbol "Me" represents a methyl group, the symbol "Et" represents an ethyl group, the symbol "iPr" represents an isopropyl group, the symbol "sBu" represents a sec-butyl group, the symbol "tBu" represents a tert-butyl group, and the symbol "$CF_3$" represents a trifluoromethyl group.

Compound No.1

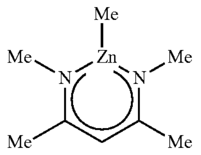

Compound No.2

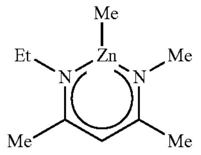

Compound No.3

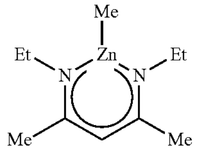

Compound No.4

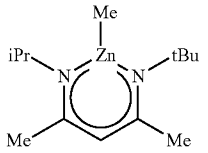

Compound No.5

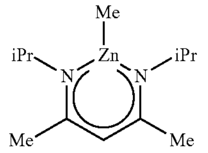

Compound No.6

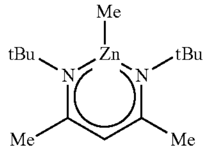

Compound No.7

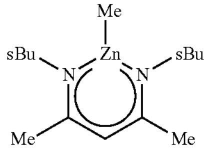

Compound No.8

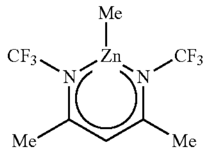

Compound No.9

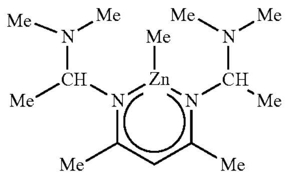

-continued
Compound No.10
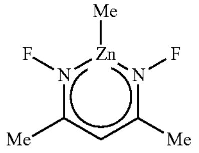
Compound No.11
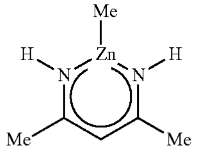
Compound No.12
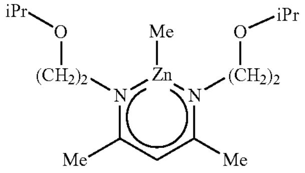
Compound No.13
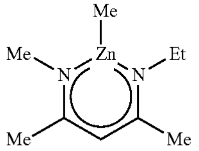
Compound No.14
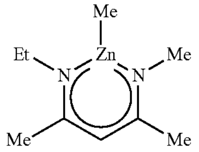
Compound No.15
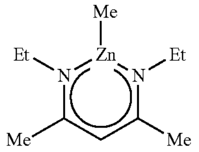
Compound No.16
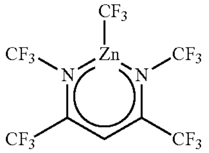
Compound No.17
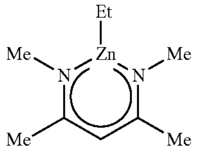
Compound No.18
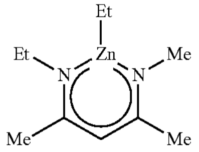
-continued
Compound No.19
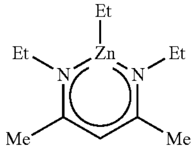
Compound No.20
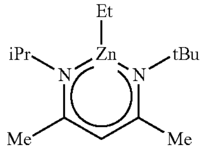
Compound No.21
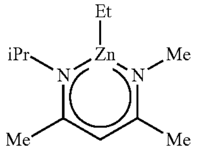
Compound No.22
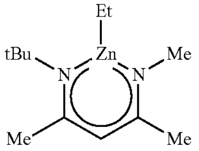
Compound No.23
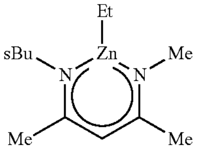
Compound No.24
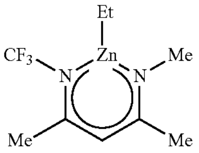
Compound No.25
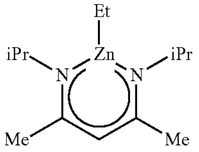
Compound No.26
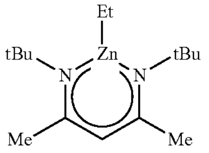
Compound No.27
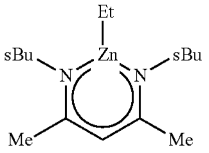
Compound No.28
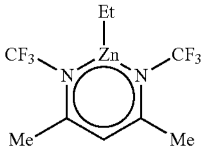

-continued
Compound No.29
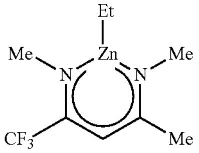
Compound No.30
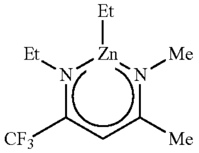
Compound No.31
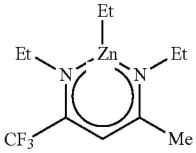
Compound No.32
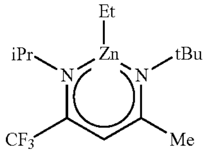
Compound No.33
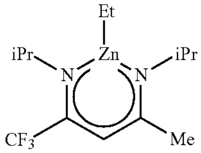
Compound No.34
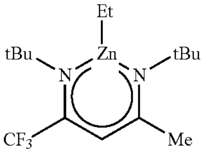
Compound No.35
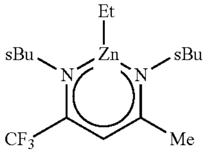
Compound No.36
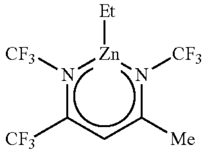
Compound No.37
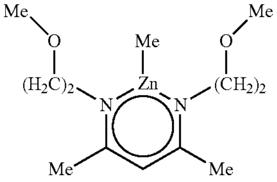
-continued
Compound No.38
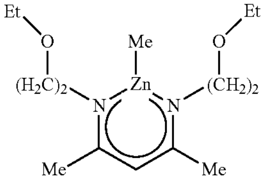
Compound No.39
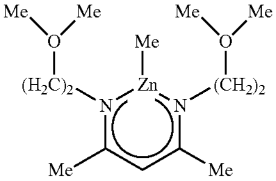
Compound No.40
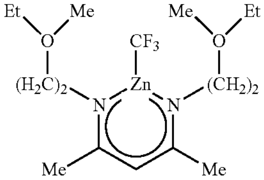
Compound No.41
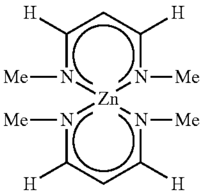
Compound No.42
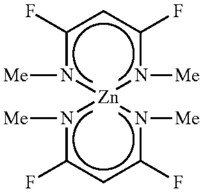
Compound No.43
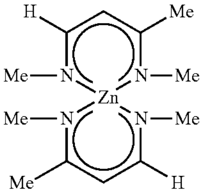
Compound No.44
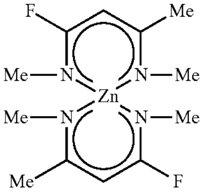
Compound No.45
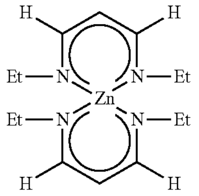

-continued
Compound No.46
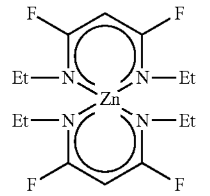
Compound No.47
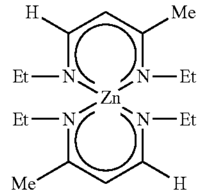
Compound No.48
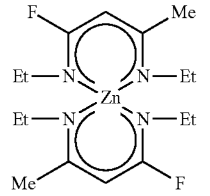
Compound No.49
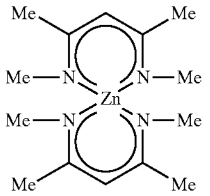
Compound No.50
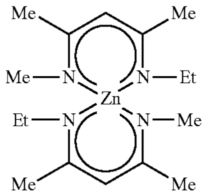
Compound No.51
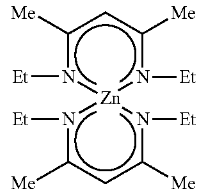
Compound No.52
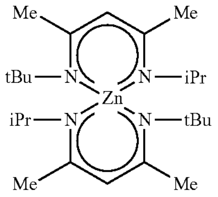
Compound No.53
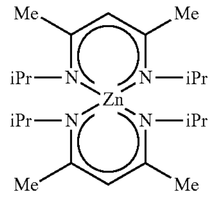
-continued
Compound No.54
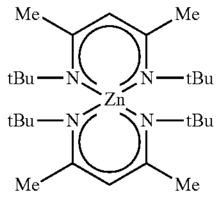
Compound No.55
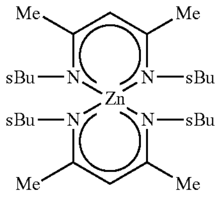
Compound No.56
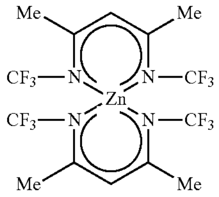
Compound No.57
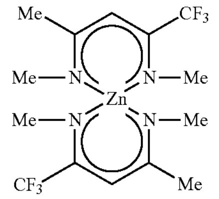
Compound No.58
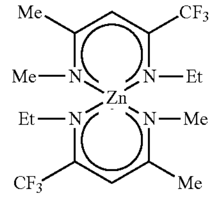
Compound No.59
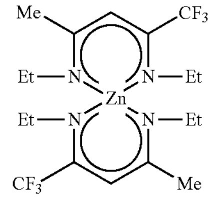
Compound No.60
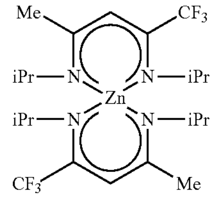
Compound No.61
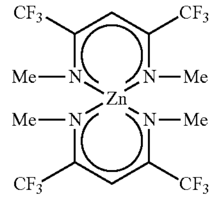

-continued

Compound No.62

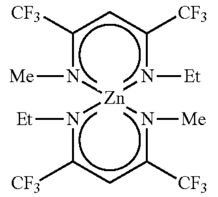

Compound No.63

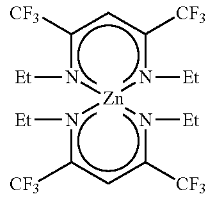

Compound No.64

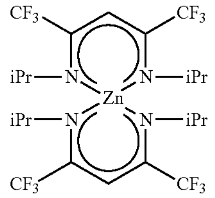

Compound No.65

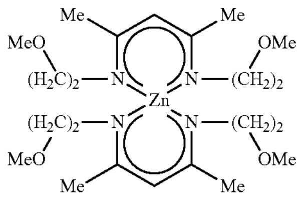

Compound No.66

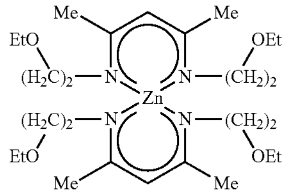

Compound No.67

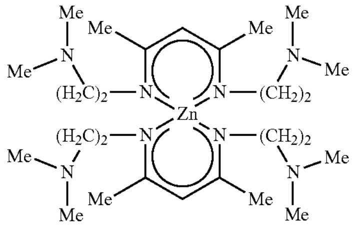

Compound No.68

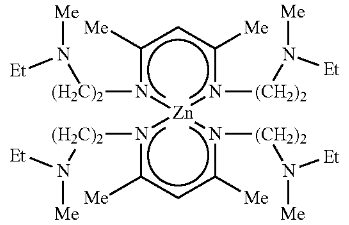

When the zinc compound of the present invention has the following physical properties, the compound may be suitably used as a precursor for a thin-film to be produced by a CVD method or an ALD method.

The zinc compound of the present invention is preferably a liquid at normal temperature from the viewpoint of handleability.

In a DSC chart obtained by increasing the temperature of the zinc compound of the present invention from room temperature to 400° C. with a differential scanning calorimeter (DSC) under the condition of a temperature increase rate of 10° C./min, the temperature at which an exothermic reaction becomes a peak top is defined as a thermal decomposition start temperature (° C.). The thermal decomposition start temperature is preferably as high as possible because the compound of the present invention is more excellent in heat resistance. The thermal decomposition start temperature is preferably 250° C. or more, more preferably 300° C. or more.

In a DTA chart obtained by increasing the temperature of the zinc compound of the present invention from room temperature with a thermogravimetric differential thermal analyzer (TG-DTA) under the conditions of 10 Torr and a temperature increase rate of 10° C./min, a temperature when the mass of the test compound reduces by 50 mass % is defined as a temperature (° C.) at the time of a 50 mass % loss in TG-DTA. The temperature at the time of a 50 mass % loss in TG-DTA is preferably as low as possible because the zinc compound can be turned into vapor at lower temperature. The temperature at the time of a 50 mass % loss in TG-DTA is preferably 180° C. or less, more preferably 160° C. or less.

Next, a thin-film forming raw material of the present invention is described.

It is only required that the thin-film forming raw material of the present invention contain the zinc compound represented by the general formula (1) or (2), and the composition thereof varies depending on the kind of an intended thin-film. For example, when a thin-film containing only zinc as a metal is produced, the thin-film forming raw material of the present invention is free of a compound of a metal other than zinc and a semimetal compound. Meanwhile, when a thin-film containing a plurality of metals and/or a semimetal is produced, the thin-film forming raw material of the present invention may contain a compound containing a desired metal and/or a compound containing a semimetal (hereinafter referred to as “other precursor”) in addition to the zinc compound represented by the general formula (1) or (2). In addition, the thin-film forming raw material of the present invention may further contain an organic solvent and/or a nucleophilic reagent as described later.

The form of the thin-film forming raw material of the present invention is appropriately selected in accordance with an approach such as a transportation and supply method for a chemical vapor deposition method to be used, such as a CVD method or an ALD method.

As the above-mentioned transportation and supply method, there are given a gas transportation method and a liquid transportation method. The gas transportation method involves: vaporizing the thin-film forming raw material, which is used in an atomic layer deposition method, of the present invention stored in a container (hereinafter simply referred to as “raw material container”) through heating and/or decompression, to thereby obtain a raw material gas; and introducing the raw material gas into a film formation chamber (hereinafter referred to as “deposition reaction portion”) having set therein a substrate together with a carrier gas, such as argon, nitrogen, or helium, to be used as required. The liquid transportation method involves: transporting the thin-film forming raw material of the present invention to a vaporization chamber under a state of a liquid or a solution; vaporizing the raw material in the vaporization chamber through heating and/or decompression, to thereby obtain a raw material gas; and introducing the raw material gas into a film formation chamber. In the case of the gas transportation method, the zinc compound represented by the general formula (1) or (2) itself may be used as the thin-film forming raw material. In the case of the liquid transportation method, the zinc compound represented by the general formula (1) or (2) itself or a solution obtained by dissolving the zinc compound in an organic solvent may be used as the thin-film forming raw material of the present invention. Those thin-film forming raw materials may each further contain the other precursor, a nucleophilic reagent, and the like.

In addition, in a multi-component chemical vapor deposition method, there are given a method involving vaporizing and supplying the thin-film forming raw material independently for each component (hereinafter referred to as "single source method"), and a method involving vaporizing and supplying a mixed raw material obtained by mixing a multi-component raw material with desired composition in advance (hereinafter referred to as "cocktail source method"). In the case of the cocktail source method, a mixture of the zinc compound represented by the general formula (1) or (2) and the other precursor or a mixed solution obtained by dissolving the mixture in an organic solvent may be used as the thin-film forming raw material. Those thin-film forming raw materials may each further contain a nucleophilic reagent and the like.

There is no particular limitation on the above-mentioned organic solvent, and a well-known general organic solvent may be used. Examples of the organic solvent include: acetic acid esters, such as ethyl acetate, butyl acetate, and methoxyethyl acetate; ethers, such as tetrahydrofuran, tetrahydropyran, ethylene glycol dimethyl ether, diethylene glycol dimethyl ether, triethylene glycol dimethyl ether, dibutyl ether, and dioxane; ketones, such as methyl butyl ketone, methyl isobutyl ketone, ethyl butyl ketone, dipropyl ketone, diisobutyl ketone, methyl amyl ketone, cyclohexanone, and methylcyclohexanone; hydrocarbons, such as hexane, cyclohexane, methylcyclohexane, dimethylcyclohexane, ethylcyclohexane, heptane, octane, toluene, and xylene; hydrocarbons each having a cyano group, such as 1-cyanopropane, 1-cyanobutane, 1-cyclohexane, cyanocyclohexane, cyanobenzene, 1,3-dicyanopropane, 1,4-dicyanobutane, 1,6-dicyanohexane, 1,4-dicyanocyclohexane, and 1,4-dicyanobenzene; and pyridine and lutidine. Those organic solvents may be used alone or as a mixture thereof depending on the solubility of a solute, the relationship among the use temperature, the boiling point, and the flash point, and the like.

When the above-mentioned organic solvent is used in the thin-film forming raw material of the present invention, the amount of the entire precursors in the thin-film forming raw material, which is a solution obtained by dissolving the precursors in the organic solvent, is preferably set to from 0.01 mol/liter to 2.0 mol/liter, in particular, from 0.05 mol/liter to 1.0 mol/liter. When the thin-film forming raw material of the present invention is free of any precursor other than the zinc compound represented by the general formula (1) or (2), the amount of the entire precursors refers to the amount of the zinc compound represented by the general formula (1) or (2). When the thin-film forming raw material of the present invention contains any other precursor in addition to the zinc compound represented by the general formula (1) or (2), the amount of the entire precursors refers to the total amount of the zinc compound represented by the general formula (1) or (2) and the other precursor.

In addition, in the case of the multi-component chemical vapor deposition method, there is no particular limitation on the other precursor to be used together with the zinc compound represented by the general formula (1) or (2), and well-known general precursors used in the thin-film forming raw material may be used.

Examples of the other precursor include compounds of: one kind or two or more kinds selected from the group consisting of compounds used as organic ligands, such as an alcohol compound, a glycol compound, a β-diketone compound, a cyclopentadiene compound, and an organic amine compound; and silicon or a metal. In addition, examples of the kind of the metal in the precursor include lithium, sodium, magnesium, aluminum, potassium, calcium, scandium, titanium, vanadium, chromium, manganese, iron, cobalt, nickel, copper, zinc, gallium, germanium, rubidium, strontium, yttrium, zirconium, niobium, molybdenum, technetium, ruthenium, rhodium, palladium, silver, indium, tin, antimony, barium, hafnium, tantalum, tungsten, rhenium, osmium, iridium, platinum, gold, lead, bismuth, radium, lanthanum, cerium, praseodymium, neodymium, promethium, samarium, europium, gadolinium, terbium, dysprosium, holmium, erbium, thulium, ytterbium, and lutetium.

Examples of the alcohol compound to be used as the organic ligand in the above-mentioned other precursor include: alkyl alcohols, such as methanol, ethanol, propanol, isopropyl alcohol, butanol, sec-butyl alcohol, isobutyl alcohol, tert-butyl alcohol, pentyl alcohol, isopentyl alcohol, and tert-pentyl alcohol; ether alcohols, such as 2-methoxyethanol, 2-ethoxyethanol, 2-butoxyethanol, 2-(2-methoxyethoxy)ethanol, 2-methoxy-1-methylethanol, 2-methoxy-1,1-dimethylethanol, 2-ethoxy-1,1-dimethylethanol, 2-isopropoxy-1,1-dimethylethanol, 2-butoxy-1,1-dimethylethanol, 2-(2-methoxyethoxy)-1,1-dimethylethanol, 2-propoxy-1,1-diethylethanol, 2-sec-butoxy-1,1-diethylethanol, and 3-methoxy-1,1-dimethylpropanol; and dialkylamino alcohols, such as dimethylaminoethanol, ethylmethylaminoethanol, diethylaminoethanol, dimethylamino-2-pentanol, ethylmethylamino-2-pentanol, dimethylamino-2-methyl-2-pentanol, ethylmethylamino-2-methyl-2-pentanol, and diethylamino-2-methyl-2-pentanol.

Examples of the glycol compound to be used as the organic ligand in the above-mentioned other precursor include 1,2-ethanediol, 1,2-propanediol, 1,3-propanediol, 2,4-hexanediol, 2,2-dimethyl-1,3-propanediol, 2,2-diethyl-1,3-propanediol, 1,3-butanediol, 2,4-butanediol, 2,2-diethyl-1,3-butanediol, 2-ethyl-2-butyl-1,3-propanediol, 2,4-pentanediol, 2-methyl-1,3-propanediol, 2-methyl-2,4-pentanediol, 2,4-hexanediol, and 2,4-dimethyl-2,4-pentanediol.

Examples of the β-diketone compound to be used as the organic ligand in the above-mentioned other precursor include: alkyl-substituted β-diketones, such as acetylacetone, hexane-2,4-dione, 5-methylhexane-2,4-dione, heptane-2,4-dione, 2-methylheptane-3,5-dione, 5-methylheptane-2,4-dione, 6-methylheptane-2,4-dione, 2,2-dimethylheptane-3,5-dione, 2,6-dimethylheptane-3,5-dione, 2,2,6-trimethylheptane-3,5-dione, 2,2,6,6-tetramethylheptane-3,5-dione, octane-2,4-dione, 2,2,6-trimethyloctane-3,5-dione, 2,6-dimethyloctane-3,5-dione, 2,9-dimethylnonane-4,6-dione, 2-methyl-6-ethyldecane-3,5-dione, and 2,2-dimethyl-6-ethyldecane-3,5-dione; fluorine-substituted alkyl β-diketones, such as 1,1,1-trifluoropentane-2,4-dione, 1,1,1-trifluoro-5,5-dimethylhexane-2,4-dione, 1,1,1,5,5,5- hexafluoropentane-2,4-dione, and 1,3-diperfluorohexylpropane-1,3-dione; and ether-substituted β-diketones, such as 1,1,5,5-tetramethyl-1-methoxyhexane-2,4-dione, 2,2,6,6-tetramethyl-1-methoxyheptane-3,5-dione, and 2,2,6,6-tetramethyl-1-(2-methoxyethoxy)heptane-3,5-dione.

Examples of the cyclopentadiene compound to be used as the organic ligand in the above-mentioned other precursor include cyclopentadiene, methylcyclopentadiene, ethylcyclopentadiene, propylcyclopentadiene, isopropylcyclopentadiene, butylcyclopentadiene, sec-butylcyclopentadiene, isobutylcyclopentadiene, tert-butylcyclopentadiene, dimethylcyclopentadiene, and tetramethylcyclopentadiene. Examples of the organic amine compound to be used as the above-mentioned organic ligand include methylamine, ethylamine, propylamine, isopropylamine, butylamine, sec-butylamine, tert-butylamine, isobutylamine, dimethylamine, diethylamine, dipropylamine, diisopropylamine, ethylmethylamine, propylmethylamine, and isopropylmethylamine.

Examples of the organic amine compound to be used as the organic ligand in the above-mentioned other precursor include methylamine, ethylamine, propylamine, isopropylamine, butylamine, sec-butylamine, tert-butylamine, isobutylamine, dimethylamine, diethylamine, dipropylamine, diisopropylamine, ethylmethylamine, propylmethylamine, and isopropylmethylamine.

The above-mentioned other precursors are known in the art, and production methods therefor are also known. For example, when the alcohol compound is used as the organic ligand, the precursor may be produced through a reaction between an inorganic salt of the metal described above or a hydrate thereof and an alkali metal alkoxide of the alcohol compound. In this case, examples of the inorganic salt of the metal or the hydrate thereof may include a halide and a nitrate of the metal. Examples of the alkali metal alkoxide may include a sodium alkoxide, a lithium alkoxide, and a potassium alkoxide.

In the case of the single source method, the above-mentioned other precursor is preferably a compound which is similar to the zinc compound represented by the general formula (1) or (2) in the behavior of thermal decomposition and/or oxidative decomposition. In the case of the cocktail source method, the above-mentioned other precursor is preferably a compound which is similar to the zinc compound represented by the general formula (1) or (2) in the behavior of thermal decomposition and/or oxidative decomposition, and in addition, which causes no change through a chemical reaction or the like at the time of mixing.

In addition, the thin-film forming raw material of the present invention may contain a nucleophilic reagent as required in order to improve the stability of each of the zinc compound represented by the general formula (1) or (2) and the other precursor. Examples of the nucleophilic reagent include: ethylene glycol ethers, such as glyme, diglyme, triglyme, and tetraglyme; crown ethers, such as 18-crown-6, dicyclohexyl-18-crown-6,24-crown-8, dicyclohexyl-24-crown-8, and dibenzo-24-crown-8; polyamines, such as ethylenediamine, N,N'-tetramethylethylenediamine, diethylenetriamine, triethylenetetramine, tetraethylenepentamine, pentaethylenehexamine, 1,1,4,7,7-pentamethyldiethylenetriamine, 1,1,4,7,10,10-hexamethyltriethylenetetramine, and triethoxytriethyleneamine; cyclic polyamines, such as cyclam and cyclen; heterocyclic compounds, such as pyridine, pyrrolidine, piperidine, morpholine, N-methylpyrrolidine, N-methylpiperidine, N-methylmorpholine, tetrahydropyran, tetrahydropyran, 1,4-dioxane, oxazole, thiazole, and oxathiolane; β-keto esters, such as methyl acetoacetate, ethyl acetoacetate, and 2-methoxyethyl acetoacetate; and β-diketones, such as acetylacetone, 2,4-hexanedione, 2,4-heptanedione, 3,5-heptanedione, and dipivaloylmethane. The usage amount of each of those nucleophilic reagents falls within preferably the range of from 0.1 mol to 10 mol, more preferably the range of from 1 mol to 4 mol with respect to 1 mol of the amount of the entire precursors.

The thin-film forming raw material of the present invention is desirably prevented from containing impurity metal elements other than the components forming the raw material, impurity halogens such as impurity chlorine, and impurity organic substances to the extent possible. The content of each of the impurity metal elements is preferably 100 ppb or less, more preferably 10 ppb or less, and the total content thereof is preferably 1 ppm or less, more preferably 100 ppb or less. In particular, when the raw material is used as a gate insulating film, a gate film, or a barrier layer of an LSI, it is required to reduce the contents of alkali metal elements and alkaline-earth metal elements that influence the electrical characteristics of a thin-film to be obtained. The content of the impurity halogens is preferably 100 ppm or less, more preferably 10 ppm or less, still more preferably 1 ppm or less. The total content of the impurity organic substances is preferably 500 ppm or less, more preferably 50 ppm or less, still more preferably 10 ppm or less. In addition, moisture causes generation of particles in the CVD raw material and generation of particles during thin-film formation, and hence it is better to remove moisture in the precursor, the organic solvent, and the nucleophilic reagent as much as possible in advance at the time of use in order to reduce moisture in each of the precursor, the organic solvent, and the nucleophilic reagent. The moisture content of each of the precursor, the organic solvent, and the nucleophilic reagent is preferably 10 ppm or less, more preferably 1 ppm or less.

In addition, the thin-film forming raw material of the present invention is preferably prevented from containing particles to the extent possible in order to reduce or prevent particle contamination of a thin-film to be formed. Specifically, in particle measurement with a light scattering liquid particle detector in a liquid phase, it is preferred that the number of particles larger than 0.3 μm be 100 or less in 1 ml of the liquid phase, and it is more preferred that the number of particles larger than 0.2 μm be 100 or less in 1 ml of the liquid phase.

Examples of a method of producing a thin-film through use of the thin-film forming raw material of the present invention include, but not limited to, a sputtering method, an ion plating method, a MOD method, such as a coating thermal decomposition method or a sol-gel method, and a CVD method. Of those, an atomic layer deposition method (sometimes referred to as "ALD method") is preferred because the method has such many advantages as described below: the method is excellent in composition controllability and step coverage, is suitable for mass production, and enables hybrid integration.

Next, a method of producing a thin-film of the present invention is described.

The method of producing a thin-film of the present invention includes the steps of: introducing a raw material gas, which is obtained by vaporizing the above-mentioned thin-film forming raw material, into a film formation chamber having set therein a substrate; and subjecting the zinc compound in the raw material gas to decomposition and/or a chemical reaction, to form a thin-film containing a zinc atom on a surface of the substrate.

The step of vaporizing the thin-film forming raw material of the present invention to provide the raw material gas may be performed in a raw material container, or may be performed in a vaporization chamber. In each case, the thin-film forming raw material of the present invention is preferably vaporized at from 0° C. to 200° C. In addition, a pressure in the raw material container and a pressure in the vaporization chamber when the thin-film forming raw material is vaporized in the raw material container or in the vaporization chamber to provide the raw material gas each preferably fall within the range of from 1 Pa to 10,000 Pa.

In addition, as a method of introducing the raw material gas, which is obtained by vaporizing the thin-film forming raw material, into the film formation chamber having set therein the substrate, there are given the above-mentioned gas transportation method, liquid transportation method, single source method, cocktail source method, and the like.

As a method of subjecting the zinc compound in the raw material gas to the decomposition and/or the chemical reaction, a reactive gas only needs to be introduced into the film formation chamber. Examples of the reactive gas include: oxidizing gases, including oxygen, ozone, nitrogen dioxide, nitrogen monoxide, water vapor, hydrogen peroxide, formic acid, acetic acid, and acetic anhydride; reducing gases, including hydrogen; and nitriding gases, including organic amine compounds, such as a monoalkylamine, a dialkylamine, a trialkylamine, and an alkylenediamine, hydrazine, and ammonia. Those reactive gases may be used alone or as a mixture thereof. Of those gases, a gas containing oxygen, ozone, or water vapor is preferably used as the reactive gas because the thin-film forming raw material of the present invention satisfactorily reacts with the oxidizing gases, including oxygen, ozone, and water vapor, at specifically low temperatures. A gas containing water vapor is preferably used as the reactive gas because a high-quality thin-film having a small residual carbon amount can be produced with high productivity.

The method of producing a thin-film according to one embodiment of the present invention is described in detail by taking a case in which a zinc-containing thin-film is formed through use of the thin-film forming raw material of the present invention by an ALD method as an example. The production method includes the steps of: introducing a raw material gas, which is obtained by vaporizing the thin-film forming raw material of the present invention, into a film formation chamber (treatment atmosphere) (raw material gas introduction step); adsorbing a zinc compound in the raw material gas onto the surface of a substrate, to form a precursor thin-film (precursor thin-film formation step); and introducing a reactive gas into the film formation chamber (treatment atmosphere), followed by reacting the precursor thin-film with the reactive gas, to form a zinc-containing thin-film on the surface of the substrate (zinc-containing thin-film formation step). In addition, the method includes a step of evacuating the gas in the film formation chamber (treatment atmosphere) (evacuation step) between the precursor thin-film formation step and the zinc-containing thin-film formation step, and after the zinc-containing thin-film formation step. In the production method, the raw material gas introduction step, the precursor thin-film formation step, the evacuation step, the zinc-containing thin-film formation step, and the other evacuation step are sequentially performed as one cycle, and the thickness of the zinc-containing thin-film can be adjusted by repeating the cycle. The respective steps of the method of producing a thin-film of the present invention are described below.

(Raw Material Gas Introduction Step)

The raw material gas introduction step is a step of vaporizing the thin-film forming raw material of the present invention to provide the raw material gas, followed by the introduction of the raw material gas into the film formation chamber having set therein the substrate.

The step of vaporizing the thin-film forming raw material of the present invention to provide the raw material gas may be performed in a raw material container, or may be performed in a vaporization chamber. In each case, the thin-film forming raw material of the present invention is preferably vaporized at from 0° C. to 200° C. In addition, a pressure in the raw material container and a pressure in the vaporization chamber when the thin-film forming raw material is vaporized in the raw material container or in the vaporization chamber to provide the raw material gas each preferably fall within the range of from 1 Pa to 10,000 Pa.

Figure 2:
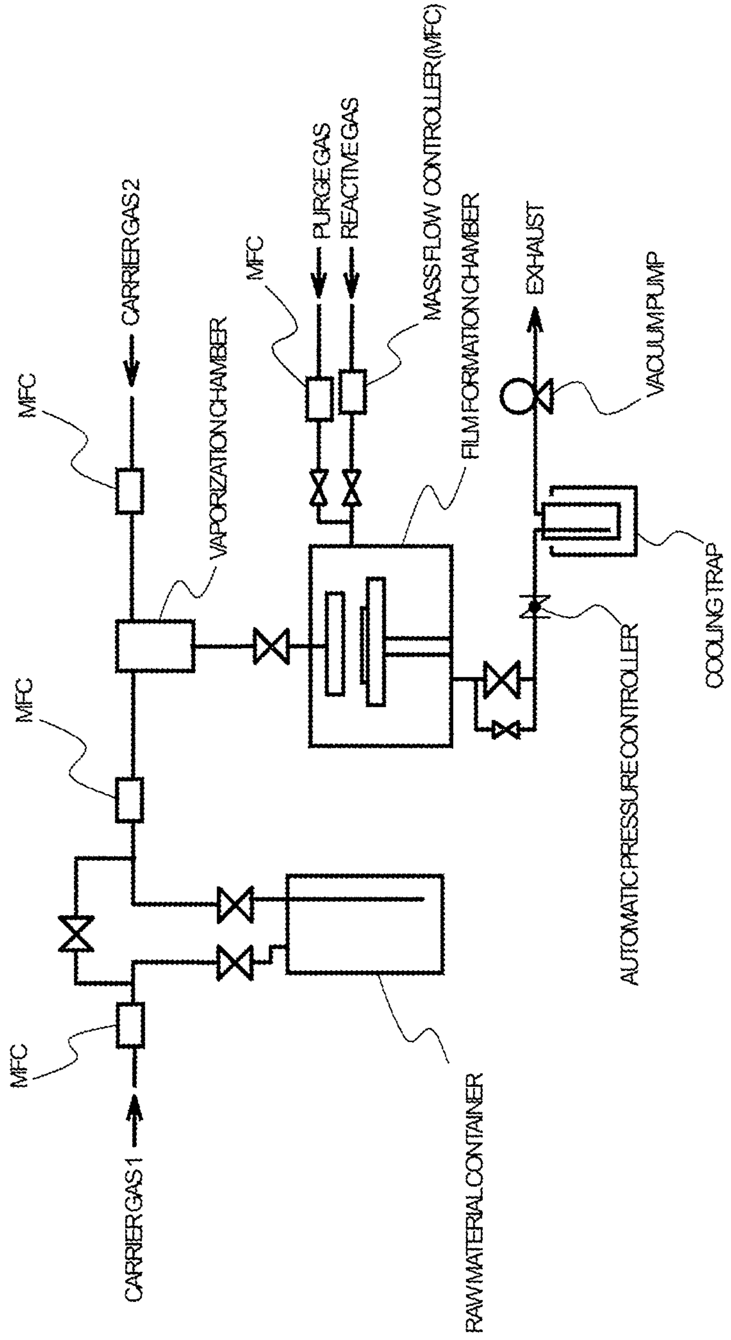
FIG. 2 is a schematic diagram for illustrating another example of the ALD apparatus to be used in the method of producing a thin-film according to the present invention.
Figure 3:
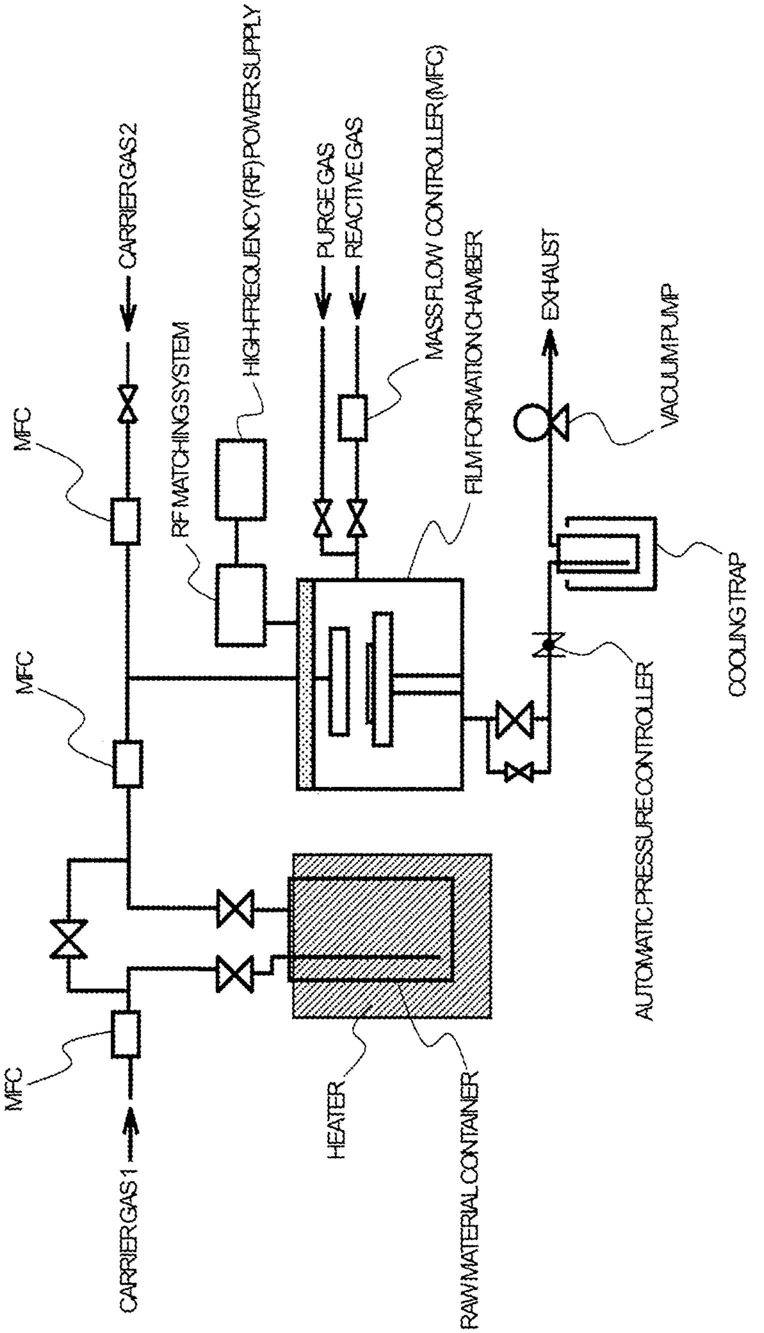
FIG. 3 is a schematic diagram for illustrating still another example of the ALD apparatus to be used in the method of producing a thin-film according to the present invention.
Figure 4:
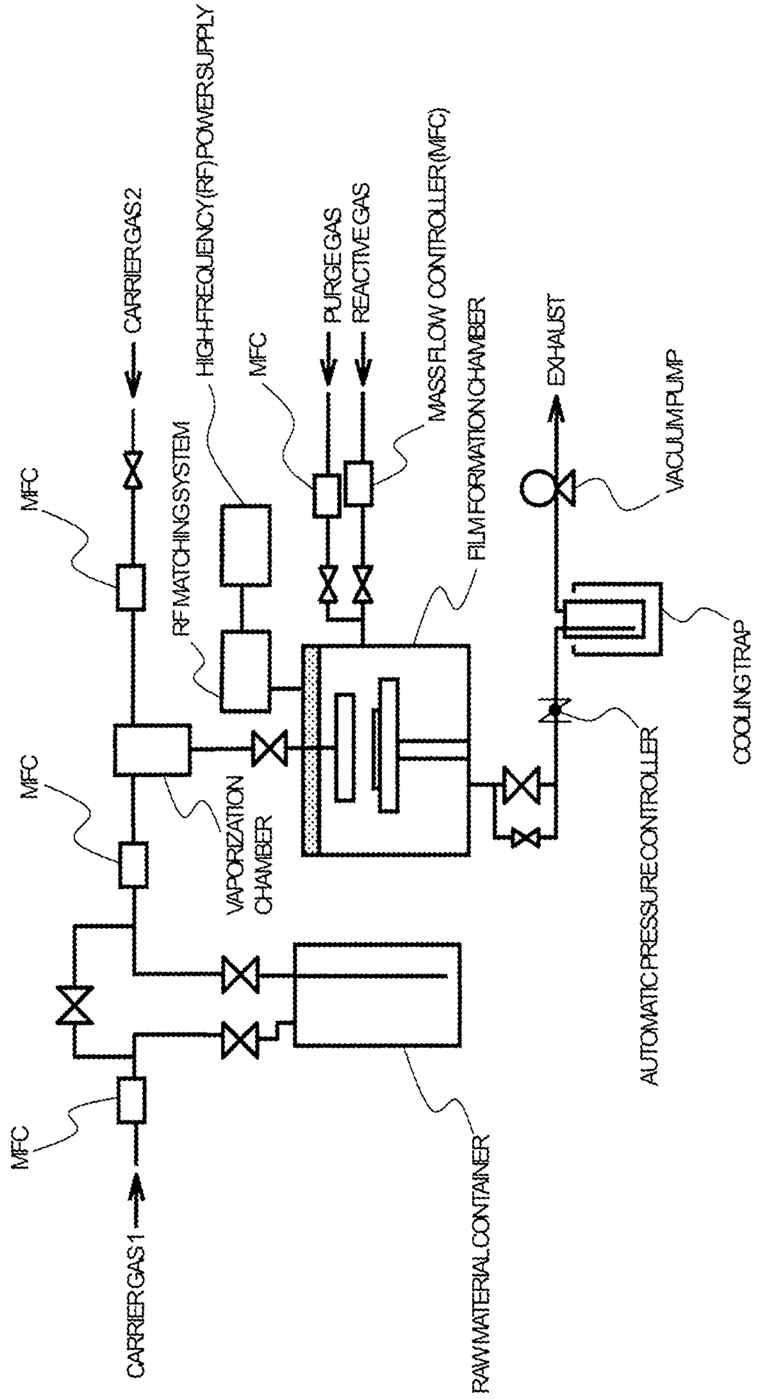
FIG. 4 is a schematic diagram for illustrating yet still another example of the ALD apparatus to be used in the method of producing a thin-film according to the present invention.

As a transportation and supply method for the thin-film forming raw material, there are given a gas transportation method and a liquid transportation method. As illustrated in FIG. 1 and FIG. 3, the gas transportation method involves: vaporizing the thin-film forming raw material of the present invention stored in a container (hereinafter referred to as "raw material container") through heating and/or decompression, to thereby obtain a raw material gas; and introducing the raw material gas into a film formation chamber having a substrate set therein together with a carrier gas, such as argon, nitrogen, or helium, to be used as required. As illustrated in FIG. 2 and FIG. 4, the liquid transportation method involves: transporting the thin-film forming raw material to a vaporization chamber under a state of a liquid or a solution; vaporizing the raw material in the vaporization chamber through heating and/or decompression, to thereby obtain a raw material gas; and introducing the raw material gas into a film formation chamber. In the case of the gas transportation method, the zinc compound represented by the general formula (1) or general formula (2) itself may be used as the thin-film forming raw material. In the case of the liquid transportation method, the zinc compound represented by the general formula (I) or general formula (2) itself or a solution obtained by dissolving the zinc compound in an organic solvent may be used as the thin-film forming raw material. Those thin-film forming raw materials may each further contain a nucleophilic reagent and the like.

In addition, the above-mentioned single source method and cocktail source method may each be used as a method to be used in the raw material gas introduction step in addition to the above-mentioned gas transportation method and liquid transportation method. However, no matter which one of the introduction methods is used, the thin-film forming raw material of the present invention is preferably vaporized at from 0° C. to 200° C. In addition, the step of vaporizing the thin-film forming raw material to provide the raw material gas may be performed in a raw material container, or may be performed in a vaporization chamber. A pressure in the raw material container and a pressure in the vaporization chamber each preferably fall within the range of from 1 Pa to 10,000 Pa.

As a material for the substrate to be set in the film formation chamber, there are given, for example: silicon; ceramics, such as silicon nitride, titanium nitride, tantalum nitride, titanium oxide, ruthenium oxide, zirconium oxide, hafnium oxide, and lanthanum oxide; glass; and metals, such as metal cobalt and metal ruthenium. The shape of the substrate is, for example, a plate shape, a spherical shape, a fibrous shape, or a scaly shape. The surface of the substrate may be planar, or may have a three-dimensional structure such as a trench structure.

(Precursor Thin-Film Formation Step)

In the precursor thin-film formation step, the zinc compound represented by the general formula (1) or general formula (2) in the raw material gas introduced into the film formation chamber having set therein the substrate is deposited on (caused to adsorb onto) the surface of the substrate to form the precursor thin-film on the surface of the substrate. At this time, heat may be applied by heating the substrate or by heating the inside of the film formation chamber. The conditions under which the precursor thin-film is formed are not particularly limited, and for example, a reaction temperature (substrate temperature), a reaction pressure, and a deposition rate may be appropriately determined in accordance with the kind and thickness of the thin-film. The reaction temperature is preferably 100° C. or more, which is a temperature at which the thin-film forming raw material of the present invention sufficiently undergoes a reaction, and is more preferably from 150° C. to 400° C.

In addition, the above-mentioned deposition rate may be controlled by the conditions (a vaporization temperature and a vaporization pressure) under which the thin-film forming raw material is supplied, the reaction temperature, and the reaction pressure. The deposition rate is preferably from 0.005 nm/min to 100 nm/min, more preferably from 0.01 nm/min to 50 nm/min because of the following reasons: when the deposition rate is large, the characteristics of the thin-film to be obtained may deteriorate; and when the deposition rate is small, a problem in terms of productivity thereof may occur.

(Evacuation Step)

After the formation of the precursor thin-film, the raw material gas that has not adsorbed onto the surface of the substrate is evacuated from the inside of the film formation chamber. In this case, it is ideal that the raw material gas be completely evacuated from the inside of the film formation chamber, but it is not always required that the raw material gas be completely evacuated. As an evacuation method, there are given, for example, a method involving purging the inside of a system in the film formation chamber with an inert gas, such as helium, nitrogen, or argon, a method involving performing evacuation by decompressing the inside of the system, and a combination of these methods. The decompression degree when decompression is performed falls within preferably the range of from 0.01 Pa to 300 Pa, more preferably the range of from 0.01 Pa to 100 Pa.

(Zinc-Containing Thin-Film Formation Step)

In the zinc-containing thin-film formation step, after the evacuation step, the reactive gas is introduced into the film formation chamber, and a zinc-containing thin-film is formed from the precursor thin-film formed in the previous precursor thin-film formation step by the action of the reactive gas or by the action of the reactive gas and the action of heat. When the reactive gas is an oxidizing gas, a zinc oxide thin-film is formed. In this step, the temperature when the heat is applied preferably falls within the range of from room temperature to 500° C., more preferably the range of from 100° C. to 400° C. The pressure of the system (in the film formation chamber) when this step is performed is preferably from 1 Pa to 10,000 Pa, more preferably from 10 Pa to 1,000 Pa. The thin-film forming raw material of the present invention has satisfactory reactivity with the oxidizing gas such as water vapor, and thus a high-quality zinc-containing thin-film having a small residual carbon amount can be produced with high productivity.

Examples of the reactive gas include: oxidizing gases, including oxygen, ozone, nitrogen dioxide, nitrogen monoxide, water vapor, hydrogen peroxide, formic acid, acetic acid, and acetic anhydride; reducing gases, including hydrogen; and nitriding gases, including organic amine compounds, such as a monoalkylamine, a dialkylamine, a trialkylamine, and an alkylenediamine, hydrazine, and ammonia. Those reactive gases may be used alone or as a mixture thereof. Of those gases, a gas containing oxygen, ozone, or water vapor is preferably used as the reactive gas because the thin-film forming raw material of the present invention satisfactorily reacts with the oxidizing gases, including oxygen, ozone, and water vapor, at low temperatures. The reactive gas is preferably a gas containing ozone or water vapor because a film thickness to be obtained per cycle is thick, and hence a thin-film can be produced with high productivity, and a gas containing water vapor is more preferred.

(Other Evacuation Step)

After the formation of the above-mentioned zinc-containing thin-film, the reactive gas that is unreacted and a by-product gas are evacuated from the inside of the film formation chamber. At this time, it is ideal that the reactive gas and the by-product gas be completely evacuated from the inside of the film formation chamber. However, it is not always required that the gases be completely evacuated. An evacuation method and a decompression degree when decompression is performed are the same as those of the evacuation step after the precursor thin-film formation step described above.

As described above, a zinc-containing thin-film having a desired film thickness is produced as follows: the raw material gas introduction step, the precursor thin-film formation step, the evacuation step, the zinc-containing thin-film formation step, and the other evacuation step are sequentially performed; deposition performed by the series of operations is defined as one cycle; and the cycle is repeated a plurality of times until a thin-film having a desired film thickness is obtained. In the method of producing a thin-film involving using an ALD method, the film thickness of the zinc-containing thin-film to be formed may be controlled by the number of the cycles.

In addition, in the method of producing a thin-film of the present invention, energy, such as plasma, light, or a voltage, may be applied, and a catalyst may be used. There is no particular limitation on the timing for applying the energy and the timing for using the catalyst. The energy may be applied or the catalyst may be used, for example, at the time of introducing the raw material gas in the raw material gas introduction step, at the time of heating in the precursor thin-film formation step or the zinc-containing thin-film formation step, at the time of evacuating the inside of the system in the evacuation step, or at the time of introducing the reactive gas in the zinc-containing thin-film formation step, or between the above-mentioned respective steps.

When plasma treatment is performed in the method of producing a thin-film of the present invention, the treatment is performed at an output of preferably from 0 W to 1,500 W, more preferably from 50 W to 600 W because an excessively large output does large damage to the substrate.

In addition, in the method of producing a thin-film of the present invention, after the thin-film formation, annealing treatment may be performed in an inert atmosphere, an oxidizing atmosphere, or a reducing atmosphere in order to obtain more satisfactory electrical characteristics. When step embedding is required, a reflow step may be provided. The temperature in this case is preferably from 200° C. to 1,000° C., more preferably from 250° C. to 500° C.

As an apparatus for producing a thin-film through use of the thin-film forming raw material of the present invention, a well-known ALD apparatus may be used. As specific examples of the apparatus, there are given an apparatus capable of performing bubbling supply of a precursor as illustrated in FIG. 1 and an apparatus including a vaporization chamber as illustrated in FIG. 2. In addition, there is given an apparatus capable of subjecting the reactive gas to plasma treatment as illustrated in FIG. 3 and FIG. 4. The apparatus is not limited to single-substrate type apparatus as illustrated in FIG. 1 to FIG. 4, and an apparatus capable of simultaneously processing a large number of substrates through use of a batch furnace may also be used.

A thin-film produced through use of the thin-film forming raw material of the present invention may be formed as desired kinds of thin-films through the coating of a substrate made of, for example, a metal, oxide ceramics, nitride ceramics, or glass, by appropriately selecting the other precursor, the reactive gas, and the production conditions. The thin-film of the present invention is excellent in electrical characteristics and optical characteristics, and hence may be widely used for the production of, for example, electrode materials for memory elements typified by DRAM elements, resistance films, diamagnetic films used in recording layers of hard disks, and catalyst materials for polymer electrolyte fuel cells.

The present invention is described in more detail by way of Examples and the like. However, the present invention is not limited by the following Examples and the like.

[Example 1] Synthesis of Compound No. 27

6.58 Milliliters (6.58 mmol in terms of diethylzinc) of a 1 mol/L solution of diethylzinc in toluene and 25 ml of dehydrated toluene were loaded into a 100 ml three-necked flask, and 1.38 g (6.58 mmol) of N,N-di-sec-butylpentane-2,4-diimine was dropped into the mixture under ice cooling, followed by stirring at room temperature for 17 hours. The solvent was evaporated under slightly reduced pressure in an oil bath at 100° C. After that, a brown transparent liquid remaining in the flask was purified through distillation under reduced pressure (from 20 Pa to 30 Pa) to provide 1.37 g (4.51 mmol, yield: 68%) of an orange transparent liquid as a distillate.

The resultant orange transparent liquid was analyzed by $^1$H-NMR and ICP-AES. As a result, the liquid was identified as Compound No. 27 that was a target compound. The analysis results of the resultant orange transparent liquid are described below.

(1) $^1$H-NMR (Deuterated Benzene)

0.68-0.81 (m, 8H), 1.15 (d, J=6.4 Hz, 6H), 1.48-1.65 (m, 7H), 1.80 (s, 6H), 3.33-3.41 (m, 2H), 4.49 (s, 1H)

(2) Results of Elemental Analysis by ICP-AES

Zn: 21.52 mass % (theoretical value: 21.52 mass %), C: 59.33 mass % (theoretical value: 59.30 mass %), H: 9.98 mass % (theoretical value: 9.95 mass %), N: 9.17 mass % (theoretical value: 9.23 mass %)

[Example 2] Synthesis of Compound No. 49

6.33 Milliliters (6.33 mmol in terms of diethylzinc) of a 1 mol/L solution of diethylzinc in toluene and 25 ml of dehydrated toluene were loaded into a 100 ml three-necked flask, and 1.60 g (12.7 mmol) of N,N-dimethylpentane-2,4-diimine was added to the mixture under ice cooling, followed by stirring at room temperature for 17 hours. The solvent was evaporated under slightly reduced pressure in an oil bath at 100° C. After that, a brown transparent liquid remaining in the flask was purified through distillation under reduced pressure (from 20 Pa to 30 Pa) to provide 1.80 g (5.70 mmol, yield: 90%) of an orange transparent liquid as a distillate.

The resultant orange transparent liquid was analyzed by $^1$H-NMR and ICP-AES. As a result, the liquid was identified as Compound No. 49 that was a target compound. The analysis results of the resultant orange transparent liquid are described below.

(1)$^1$H-NMR (Deuterated Benzene)

1.81 (s, 12H), 2.97 (s, 12H), 4.54 (s, 2H)

(2) Results of Elemental Analysis by ICP-AES

Zn: 20.66 mass % (theoretical value: 20.70 mass %), C: 53.28 mass % (theoretical value: 53.25 mass %), H: 8.32 mass % (theoretical value: 8.31 mass %), N: 17.74 mass % (theoretical value: 17.74 mass %)

[Example 3] Synthesis of Compound No. 59

4.17 Milliliters (4.17 mmol in terms of diethylzinc) of a 1 mol/L solution of diethylzinc in toluene and 25 ml of dehydrated toluene were loaded into a 100 ml three-necked flask, and 1.74 g (8.34 mmol) of N,N-diethyl-1,1,1-trifluoropentane-2,4-diimine was added to the mixture under ice cooling, followed by stirring at room temperature for 17 hours. The solvent was evaporated under slightly reduced pressure in an oil bath at 100° C. After that, a brown transparent liquid remaining in the flask was purified through distillation under reduced pressure (from 20 Pa to 30 Pa) to provide 1.81 g (3.77 mmol, yield: 90%) of an orange transparent liquid as a distillate.

The resultant orange transparent liquid was analyzed by $^1$H-NMR and ICP-AES. As a result, the liquid was identified as Compound No. 59 that was a target compound. The analysis results of the resultant orange transparent liquid are described below.

(1)$^1$H-NMR (Deuterated Benzene)

0.91 (t, J=7.2 Hz, 6H), 1.10 (t, J=7.2 Hz, 6H), 1.54 (s, 6H), 2.93-3.08 (m, 4H), 3.47-3.60 (m, 4H), 5.01 (s, 2H)

(2) Results of Elemental Analysis by ICP-AES

Zn: 13.60 mass % (theoretical value: 13.63 mass %), C: 45.07 mass % (theoretical value: 45.06 mass %), H: 5.93 mass % (theoretical value: 5.88 mass %), N: 11.62 mass % (theoretical value: 11.67 mass %), F: 23.78 mass % (theoretical value: 23.76 mass %)

The following evaluations were performed by using Compound No. 27 obtained in Example 1, Compound No. 49 obtained in Example 2, Compound No. 59 obtained in Example 3, and diethylzinc serving as Comparative Compound 1.

(1) Melting Point Evaluation

The state of each of the compounds at normal pressure and 25° C. was visually observed, and the melting point of a solid compound was measured with a micro melting point-measuring device. The results are shown in Table 1.

(2) Thermal Decomposition Start Temperature (° C.)

In a DSC chart measured with a differential scanning calorimeter (DSC) at a temperature increase rate of 10° C./min in the scanning temperature range of from 30° C. to 500° C., the temperature at which an exothermic reaction became a peak top was defined as a "thermal decomposition start temperature (° C.)." The results are shown in Table 1.

(3) Temperature (° C.) at Time of 50 Mass % Loss in Reduced-Pressure TG-DTA

The weight of the test compound was measured with a TG-DTA at 10 Torr, an argon flow rate of 50 mL/min, and a temperature increase rate of 10° C./min in the scanning temperature range of from 30° C. to 600° C., and a temperature (° C.) when the mass of the test compound reduced by 50 mass % was evaluated as a "temperature (° C.) at the time of a 50 mass % loss in reduced-pressure TG-DTA." A lower temperature (° C.) at the time of a 50 mass % loss in reduced-pressure TG-DTA means that vapor is obtained at lower temperature. The results are shown in Table 1.

TABLE 1

| Compound | Melting point evaluation | Thermal decomposition start temperature | Temperature at time of 50 mass % loss in reduced-pressure TG-DTA |
|---|---|---|---|
| Compound No. 27 | Liquid | 303° C. | 125° C. |
| Compound No. 49 | Liquid | 393° C. | 155° C. |
| Compound No. 59 | Liquid | 312° C. | 138° C. |
| Comparative Compound 1 | Liquid | 183° C. | — |

It was able to be recognized from the foregoing results that each of Compound No. 27, Compound No. 49, and Compound No. 59 had a thermal decomposition start temperature in the range of from 300° C. to 400° C., and was hence excellent in thermal stability. In addition, it was able to be recognized that each of Compound No. 27, Compound No. 49, and Compound No. 59 had a temperature at the time of a 50 mass % loss in reduced-pressure TG-DTA of less than 160° C., and hence vapor was obtained at low temperature. It was able to be recognized from those results that the zinc compound of the present invention was useful as a thin-film forming raw material. In contrast, Comparative Compound 1 was not satisfactory as a thin-film forming raw material because of its poor thermal stability.

Next, a thin-film produced by using the zinc compound of the present invention as a thin-film forming raw material was evaluated.

Example 4

A thin-film was produced on silicon dioxide that was a substrate under the following conditions by using Compound No. 27 as a thin-film forming raw material and by using the ALD apparatus illustrated in FIG. 1. The composition of the thin-film was analyzed by using X-ray photoelectron spectroscopy. As a result, it was recognized that the thin-film was a thin-film containing zinc oxide, and its residual carbon amount was smaller than 0.01 atom % that was a detection limit. In addition, the film thickness of the thin-film was measured by using an X-ray reflectivity method. As a result, the thin-film formed on the substrate was a smooth film having a film thickness of 15 nm, and a film thickness obtained per cycle was about 0.03 nm.

(Conditions)

Production method: ALD method

Reaction temperature (substrate temperature): 200° C.

Reactive gas: Water vapor (Steps)

A series of steps formed of the following (1) to (4) was defined as one cycle, and the cycle was repeated 500 times.

(1) A raw material gas, which is obtained by vaporizing a thin-film forming raw material under the conditions of a raw material container temperature of 60° C. and a raw material container internal pressure of 100 Pa, is introduced into a film formation chamber, and the raw material gas is caused to adsorb onto the surface of a substrate at a system pressure of 100 Pa for 10 seconds, to thereby form a precursor thin-film.

(2) The raw material gas that has not adsorbed onto the surface of the substrate is evacuated from the inside of the system through argon purging for 15 seconds.

(3) A reactive gas is introduced into the film formation chamber, and the precursor thin-film and the reactive gas are caused to react with each other at a system pressure of 100 Pa for 0.2 second.

(4) The reactive gas that is unreacted and a by-product gas are evacuated from the inside of the system through argon purging for 60 seconds.

Example 5

A thin-film was produced on silicon dioxide that was a substrate under the following conditions by using Compound No. 49 as a thin-film forming raw material and by using the ALD apparatus illustrated in FIG. 1. The composition of the thin-film was analyzed by using X-ray photoelectron spectroscopy. As a result, it was recognized that the thin-film was a thin-film containing zinc oxide, and its residual carbon amount was smaller than 0.01 atom % that was a detection limit. In addition, the film thickness of the thin-film was measured by using an X-ray reflectivity method. As a result, the thin-film formed on the substrate was a smooth film having a film thickness of 17 nm, and a film thickness obtained per cycle was about 0.03 nm.

(Conditions)

Production method: ALD method

Reaction temperature (substrate temperature): 350° C.

Reactive gas: Ozone (Steps)

A series of steps formed of the following (1) to (4) was defined as one cycle, and the cycle was repeated 500 times.

(1) A raw material gas, which is obtained by vaporizing a thin-film forming raw material under the conditions of a raw material container temperature of 60° C. and a raw material container internal pressure of 100 Pa, is introduced into a film formation chamber, and the raw material gas is caused to adsorb onto the surface of a substrate at a system pressure of 100 Pa for 10 seconds, to thereby form a precursor thin-film.

(2) The raw material gas that has not adsorbed onto the surface of the substrate is evacuated from the inside of the system through argon purging for 15 seconds.

(3) A reactive gas is introduced into the film formation chamber, and the precursor thin-film and the reactive gas are caused to react with each other at a system pressure of 100 Pa for 20 seconds.

(4) The reactive gas that is unreacted and a by-product gas are evacuated from the inside of the system through argon purging for 30 seconds.

Example 6

A thin-film was produced on silicon dioxide that was a substrate under the following conditions by using Compound. No. 59 as a thin-film forming raw material and by using the ALD apparatus illustrated in FIG. 1. The composition of the thin-film was analyzed by using X-ray photoelectron spectroscopy. As a result, it was recognized that the thin-film was a thin-film containing zinc oxide, and its residual carbon amount was smaller than 0.01 atom % that was a detection limit. In addition, the film thickness of the thin-film was measured by using an X-ray reflectivity method. As a result, the thin-film formed on the substrate was a smooth film having a film thickness of 20 nm, and a film thickness obtained per cycle was about 0.04 nm.

(Conditions)

Production method: ALD method

Reaction temperature (substrate temperature): 350° C.

Reactive gas: Ozone (Steps)

A series of steps formed of the following (1) to (4) was defined as one cycle, and the cycle was repeated 500 times.

(1) A raw material gas, which is obtained by vaporizing a thin-film forming raw material under the conditions of a raw material container temperature of 60° C. and a raw material container internal pressure of 100 Pa, is introduced into a film formation chamber, and the raw material gas is caused to adsorb onto the surface of a substrate at a system pressure of 100 Pa for 10 seconds, to thereby form a precursor thin-film.

(2) The raw material gas that has not adsorbed onto the surface of the substrate is evacuated from the inside of the system through argon purging for 15 seconds.

(3) A reactive gas is introduced into the film formation chamber, and the precursor thin-film and the reactive gas are caused to react with each other at a system pressure of 100 Pa for 20 seconds.

(4) The reactive gas that is unreacted and a by-product gas are evacuated from the inside of the system through argon purging for 30 seconds.

Comparative Example 1

A thin-film was produced on silicon dioxide that was a substrate under the same conditions as those of Example 4 except that Comparative Compound 1 (diethylzinc) was used as a thin-film forming raw material. The composition of the thin-film was analyzed by using X-ray photoelectron spectroscopy. As a result, the thin-film was a thin-film containing zinc oxide, but residual carbon was detected. In addition, the state of the thin-film was observed by using scanning electron microscopy. As a result, the thin-film formed on the substrate was not smooth, and hence its film thickness could not be measured.

It was recognized from the foregoing that the zinc compound of the present invention was able to be turned into vapor at low temperature, and was excellent in thermal stability. In addition, it was recognized that the use of the thin-film forming raw material including the zinc compound of the present invention was able to produce a high-quality zinc-containing thin-film.

The invention claimed is:

1. A zinc compound, which is represented by the following general formula (1) or Compound No. 51:

(1)

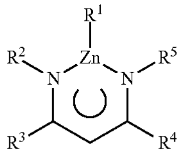

in the formula (1), $R^1$ represents an unsubstituted alkyl group having 1 to 5 carbon atoms;

$R^2$ and $R^5$ each independently represent an unsubstituted alkyl group having 3 to 5 carbon atoms;

$R^3$ and $R^4$ each independently represent an unsubstituted alkyl group having 1 to 5 carbon atoms;

Compound No. 51

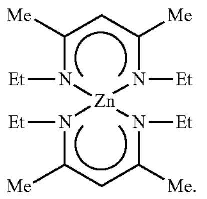

2. A thin-film forming raw material, comprising the zinc compound of claim 1.

3. A method of producing a thin-film containing a zinc atom through use of the zinc compound of claim 1 as a precursor by a chemical vapor deposition method.

4. A method of producing a thin-film, comprising the steps of:

introducing a raw material gas, which is obtained by vaporizing the thin-film forming raw material of claim 2, into a film formation chamber having set therein a substrate; and subjecting the zinc compound in the raw material gas to decomposition and/or a chemical reaction, to form a thin-film containing a zinc atom on a surface of the substrate.

5. The method of producing a thin-film according to claim 4, wherein the method comprises the steps of:

adsorbing the zinc compound in the raw material gas onto the surface of the substrate, to form a precursor thin-film; and subjecting the precursor thin-film to a reaction with a reactive gas, to form the thin-film containing a zinc atom on the surface of the substrate.

6. The method of producing a thin-film according to claim 5, wherein the reactive gas is an oxidizing gas, and the thin-film is a zinc oxide thin-film.

7. The method of producing a thin-film according to claim 6, wherein the oxidizing gas is a gas containing oxygen, ozone, or water vapor.

8. The method of producing a thin-film according to claim 7, wherein the step of subjecting the precursor thin-film to a reaction with the reactive gas is performed at a temperature within a range of from 100° C. to 400° C.

* * * * *